United States Patent

Kim

[15] 3,694,697

[45] Sept. 26, 1972

[54] TRANSISTOR CIRCUIT FOR SEQUENTIALLY FLASHING PHOTOFLASH LAMPS

[72] Inventor: Sang-Chul Kim, 3670 Woodridge Road, Cleveland Heights, Ohio 44121

[73] Assignee: General Electric Company

[22] Filed: Dec. 28, 1970

[21] Appl. No.: 101,861

[52] U.S. Cl. ..................315/325, 307/293, 315/232, 315/241 P, 315/323, 328/75

[51] Int. Cl. ........................H05b 41/34, H05b 41/38

[58] Field of Search......................315/228–232, 250, 315/251, 313, 323, 241 P, 87, 325; 328/75; 307/293; 340/250, 251, 331

[56] References Cited

UNITED STATES PATENTS

| | | | |
|---|---|---|---|
| 3,518,487 | 6/1970 | Tanaka et al. | 315/232 |
| 3,532,931 | 10/1970 | Cote et al. | 315/323 X |
| 2,955,201 | 10/1960 | Miller | 315/323 X |
| 2,995,926 | 8/1961 | Dory | 315/231 |
| 3,560,769 | 2/1971 | Shimizu et a. | 307/293 |
| 3,590,314 | 6/1971 | Krusche | 328/75 |

*Primary Examiner*—Alfred L. Brody
*Attorney*—Norman C. Fulmer, Henry P. Truesdell, Frank L. Neuhauser, Oscar B. Waddell and Joseph B. Forman

[57] ABSTRACT

A circuit combination of impedance devices and a transistor amplifier for causing sequential flashing of a plurality of photoflash lamps by sequential firing voltage pulses. The transistor amplifier is connected between a source of firing pulses and an impedance network constituted by the flash lamps and impedance devices, this impedance network functioning as the output load of the amplifier. The transistor amplifier causes differing amounts of sequential firing pulse power to be applied to the impedance network, in accordance with changing impedance of the network as the various lamps are flashed, so that the lamps will be flashed by equal amounts of firing pulse energy.

8 Claims, 4 Drawing Figures

PATENTED SEP 26 1972

3,694,697

Inventor:
Sang-Chul Kim
by Norman C. Fulmer
His Attorney

TRANSISTOR CIRCUIT FOR SEQUENTIALLY FLASHING PHOTOFLASH LAMPS

BACKGROUND OF THE INVENTION

The invention is in the field of electrical circuitry for sequentially flashing photoflash lamps, and is particularly useful with a unitary array of flash lamps, such as three or four or more lamps arranged to radiate their light in the same direction when they are sequentially flashed, so that the array need not be moved nor removed until all of its lamps have been flashed.

Numerous circuits have been devised for sequentially flashing photoflash lamps by pulses of electrical energy such as are obtained from a battery through a momentarily closed switch or from a capacitor which has been charged through a resistor from a battery, or from some other suitable energy source. Such a pulse of electrical energy usually is initiated by closure of a switch associated with the shutter mechanism of a camera. One type of circuit heretofore proposed employs mechanically actuated switches for applying the electrical pulses to successively different flashbulbs; another type of circuit utilizes heat-responsive or light-responsive means associated with the flash lamps and adapted to actuate switching means for connecting the pulse source to successively different flash lamps as each of the lamps becomes flashed; and a further type of circuit utilizes transistors or thyristors for automatically connecting the pulse source to successively different flash lamps as each of the lamps becomes flashed.

Another previously proposed type of circuit employs impedance means, such as resistors, successively connected in series with a plurality of individual flash lamps, so that the lamps are connected in electrical parallel through the resistors. The firing pulse source is connected to an end of the circuit, whereby each flash lamp is connected across the pulse source through successively greater resistance. The first pulse flashes the nearest lamp, which becomes an open circuit upon flashing, whereupon the next pulse flashes the next lamp, etc. As each successive lamp is flashed, its firing pulse flows through successively greater values of power-consuming series resistance, so that the later lamps in the array receive considerably less of the firing pulse energy than do the earlier lamps. The firing pulses must have ample energy to ensure flashing of the later lamps in the circuit, and therefore the earlier lamps receive much greater firing pulse energy than is needed for flashing them. In order to insure flashing of only one flash lamp (the nearest unflashed lamp to the pulse source) per firing pulse, it is desirable that the series resistors have relatively large values of resistance as compared to the resistances of the flash lamp filaments. On the other hand, low values of series resistances are desired, because large values of series resistance consume relatively large amounts of energy from the firing pulse so that it is desirable to provide a greater amount of firing pulse energy to insure that all of the lamps can be flashed. It has been found that this dilemma of desiring larger resistance values for one reason, and smaller resistance values for another reason, is not easy to resolve satisfactorily for insuring that only one flash lamp will flash per firing pulse and also that the energy per pulse will be capable of successively flashing all of the lamps of the array, with an economically feasible value of firing pulse voltage. These difficulties tend to offset an important advantage of the resistance network circuit: its low cost, so that the resistor circuit can be included in a throw-away multiple lamp unit, whereby only two electrical connections need be provided between the multiple lamp unit and the camera or flash adaptor with which it is used.

The reliability of the above-described resistance sequential flashing circuit can be improved if the flash lamps of the array have differing filament resistances, the lamp nearest the firing pulse source having the lowest filament resistance and the remaining lamps having successively higher values of filament resistance. However, this expedient suffers the disadvantage of higher costs of manufacturing the different-resistance lamps and of keeping track of which lamps have which filament resistance during storage and during assembly into the flash array. Another disadvantage of an array in which the lamps have differing filament resistances, is a reduction of flashing reliability because some of the lamps will not have optimum filament resistance for being flashed by the firing pulse.

SUMMARY OF THE INVENTION

Objects of the invention are to provide an improved circuit for sequentially flashing flashbulbs; to provide such a circuit which is free from the above-described disadvantages of prior resistance types of circuits; and to provide such a circuit that is highly reliable in operation and which can function with relatively less firing pulse energy than previous circuits.

The invention comprises, briefly and in a preferred embodiment, a plurality of photoflash lamps intended to be sequentially flashed by a sequential series of firing voltage pulses, impedance means electrically interconnecting said lamps and forming in combination therewith an impedance network to cause the lamps to be flashed sequentially by said firing pulses, the impedance of said impedance network being subject to change upon flashing of said lamps, and a transistor amplifier connected between said impedance network and a source of said firing pulses so that said impedance network functions as the output load of the amplifier. The transistor amplifier causes differing amounts of sequential firing pulse power to be applied to the impedance network, in accordance with changing impedance of the network as the various lamps are flashed, so that the lamps will be flashed by equal amounts of firing pulse energy.

DESCRIPTION OF THE PREFERRED EMBODIMENT

Figures 1, 2, 3:
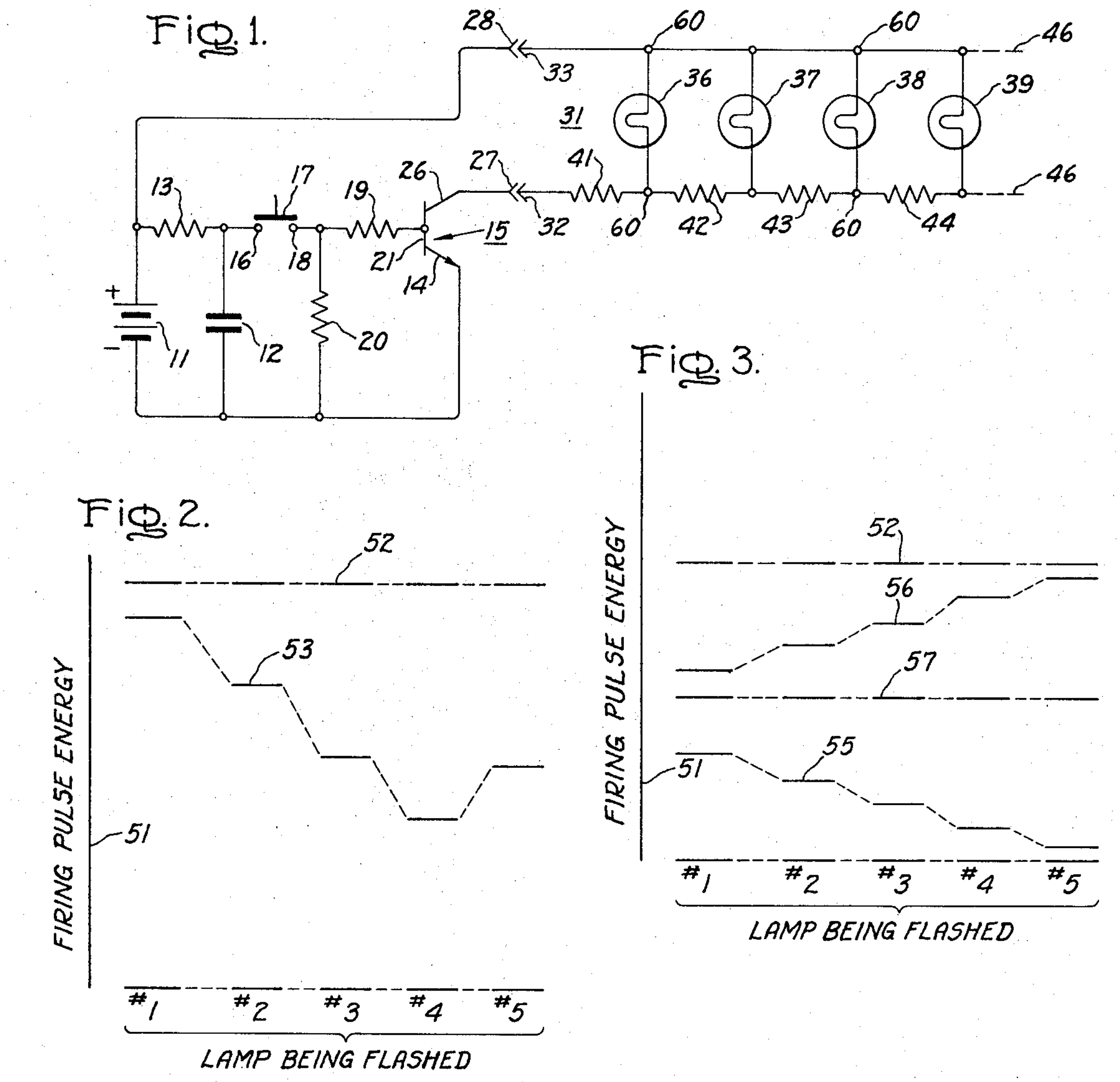
FIG. 1 is an electrical schematic diagram of a preferred embodiment of the invention.
FIG. 2 is a chart illustrating the operation of the circuit of FIG. 1 when the transistor amplifier is omitted.
FIG. 3 is a chart illustrating the operation of the circuit of FIG. 1 employing a transistor amplifier in accordance with the invention.
Figure 4:
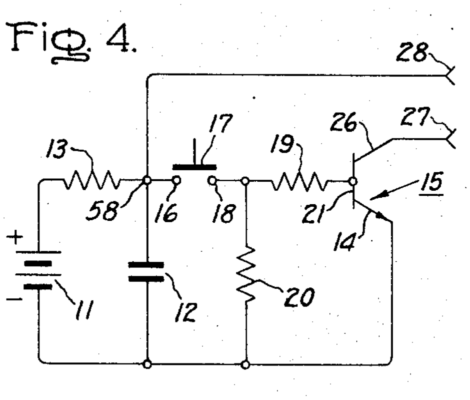
FIG. 4 is a schematic diagram of an alternative embodiment of the invention.

In the circuit of FIG. 1, a battery 11 is connected to charge a capacitor 12 through a resistor 13. In a preferred arrangement, the battery 11 has a voltage of 6 volts, the capacitor 12 has a capacitance of 100 microfarads, and the resistor 13 has a resistance of 1000 ohms. One terminal of the capacitor 12 is connected to an emitted electrode 14 of an amplifier transistor 15, and the other terminal of capacitor 12 is connected to a terminal 16 of a switch 17, the other terminal 18 thereof being connected through a resistor 19 to a base electrode 21 of the transistor 15. A resistor 20 is connected between the switch terminal 18 and the emitter 14 and has a relatively large value of resistance such as 5000 ohms. The switch 17 is adapted to be momentarily closed in synchronization with the opening of a camera shutter, in well known manner. A collector electrode 26 of transistor 15 is connected to a first connector terminal 27, and the junction of the battery 11 and resistor 13 is connected to a second connector terminal 28. The circuitry thus far described functions as a source of electrical energy pulses applied at the connector terminals 27 and 28 for flashing photoflash lamps, and may be incorporated in a camera, or in a flash attachment for use with a camera. Although the firing pulse is sometimes called a "voltage" pulse, it is primarily the energy of the pulse, comprising the product of voltage, current, and time duration, that causes a lamp to flash.

A flash lamp array unit 31 is provided with a pair of connector prongs 32 and 33 adapted for electrical engagement with the terminals 27 and 28, respectively. The unit 31 contains a plurality of photoflash lamps 36 through 39 which may be of conventional type, such as General Electric type AG-1, each containing a filament provided with electrical connection lead wires and adapted for initiating a flash of combustible material contained within the bulb. One end of the filaments of each of the lamps 36–39 is connected to the connector prong 33. The other end of the filaments of lamps 36–39 are successively connected, through a series of resistors 41 through 44, to the connector prong 32. The resistors 41–44 may be individual resistors or they may be a single resistor tapped at appropriate points. Other impedance means, such as diodes or inductances, may be used instead of resistors. Various desired numbers of flash lamps and impedance devices can be added to the circuit as indicated by dashed lines 46. Thus, in effect, the lamps 36–39 are connected in a parallel combination through the resistors 41–44, this parallel combination being adapted for connection across the source of energy pulses at the terminals 27 and 28, each successive lamp being connected to the pulse source through a successively greater value of resistance. Typically, each of the lamps 36–39 may have a filament resistance of about 0.6 ohms, and each of the resistors 41–44 may have a resistance of about 5 or 6 ohms. The resistance of resistor 19 is about one thousand ohms.

Preferably the lamps 36–39 of the array 31 are provided with individual reflectors, and arranged to radiate the light emitted therefrom in the same direction. If desired, another combination of lamps and impedance may be provided in the unit 31, for radiating the light emission in the opposite direction, so that when all of the lamps at the front of the unit have been flashed, the unit may be turned around so that the rear array of lamps will then face frontwardly, for obtaining an additional number of flashes from a single unit. Other connector prongs similar to 32 and 33 can be provided for connecting the rear array of lamp circuitry to the connectors 27 and 28 when the unit is turned around so that the "rear" array of flash lamps faces frontwardly.

The operation of the circuit of FIG. 1 will now be described, first (with reference to FIG. 2) with the transistor amplifier 15 omitted and with the connectors 27 and 28 connected directly across the resistor 20, and then the operation will be described (with reference to FIG. 3) with the amplifier in the circuit as shown in FIG. 1, in accordance with the invention.

Assume the transistor amplifier 15 is omitted, as just described. Upon a momentary closing the switch 17, in synchronization with the opening of a camera shutter, the electrical energy stored in the capacitor 12 discharges into the circuit of the lamp unit 31, in the form of an electrical pulse having an approximately exponential decay characteristic. Most of the capacitor's electrical energy discharges through the filament of the first lamp 36, and, although a small portion of the energy flows through the filament of lamp 37 via the resistor 42, the voltage drop across the resistor 42 is intended to limit the amount of electrical energy discharged through the filament of lamp 37 to a value below that which will cause lamp 37 to flash. The remaining resistors in the circuit further limit the amount of energy discharged into the remaining flash lamps. As the electrical energy of the pulse from capacitor 12 discharges through the filament of lamp 36, the filament resistance (which initially is about 0.6 ohms) increases as the filament becomes incandescent, and the filament burns out and becomes an open circuit as the lamp flashes. The moment at which the lamp 36 flashes and its filament becomes an open circuit, is a critical moment at which the next lamp 37 is most likely to undesirably flash, because when the filament of lamp 36 becomes an open circuit the remaining energy in capacitor 12, minus the voltage drop provided by the resistors 41 and 42, is available for the remaining lamps.

Upon the next momentary closing of the switch 17, in synchronization with the opening of the camera shutter, most of the electrical discharge pulse energy from the capacitor 12 flows through the second flash lamp 37, since the first lamp 36 now is an open circuit. The energy discharge through lamp 37 is reduced by the voltage drop across the resistors 41 and 42, but is ample for causing the lamp 37 to flash. As was the case when lamp 36 was being flashed, the next successive resistor 43 is intended to reduce the voltage, and hence energy, flowing to the remaining lamps so that they will not flash.

Thus, as each next successive lamp is flashed, its firing pulse passes through a greater value of energy-consuming resistance and each lamp receives successively less energy from the firing pulse. This is illustrated in FIG. 2, in which the successive lamps (five of them, for example) are represented along the horizontal base line, as indicated, and the vertical axis 51 represents firing pulse energy. The plot 52 indicates, in the solid-line portions thereof, the firing pulse energy applied to the lamp circuit terminals 32, 33 by the discharge of the capacitor 12, upon flashing each of the five lamps, this energy being the same value for each lamp flashing. The plot 53 indicates, in the solid-line portions thereof, the amount of firing pulse energy that reaches each successive lamp that is being flashed. As explained above, only part of the firing pulse energy is applied to the lamp being flashed, due to firing pulse energy consumption both in the resistance in series with the lamp being flashed and also in the shunt resistance path formed by the remaining unflashed lamps and their associated resistors. As a result, and as shown by the plot 53, each successive lamp that is flashed receives considerably less firing pulse energy than the preceding lamp, with exception of the last lamp which receives a bit more firing pulse energy than did the preceding lamp because there is not unflashed lamp and associated resistor in shunt with the last lamp. The total resistance of the network formed by the lamps and resistors increases successively with each lamp flashed, until it becomes an open circuit when all lamps have been flashed. As explained earlier, the differing amounts of firing pulse energy that are successively applied to the lamps being flashed makes it difficult to design a circuit which will reliably flash a single lamp upon the occurrence of each firing pulse, and such design is all the more difficult when reasonable manufacturing tolerances are set for the resistor values and lamp filament characteristics.

The circuit of FIG. 1, with the transistor amplifier 15 connected as shown, operates as follows, in accordance with the invention and with reference to FIG. 3. The emitter-collector path of transistor 15 normally is an open circuit, due to the base 21 being biased at the emitter potential via the resistors 19 and 20, and thus the battery 11 is disconnected from the impedance network of the lamp array 31. Upon momentary closing of the switch 17, in synchronism with the opening of a camera shutter, the voltage of the capacitor 12 is applied to the base 21 of transistor 15, rendering the emitter-collector path 14, 26 thereof "conductive" and applying current from the battery 11 to the array network 31 via the resistance of the emitter-collector path 14, 26. The transistor 15 thus remains conductive until the capacitor 12 discharges sufficiently through the resistors 19 and 20 so that its voltage becomes so small that the transistor 15 is biased to non-conduction condition. The resistance of the charging resistor 13 is sufficiently greater than that of the discharge resistors 19 and 20 so that the capacitor 12 will discharge through resistors 19 and 20 rather than acquire any significant voltage charge from the battery 11 via the charging resistor 13. Upon opening of the momentarily closed shutter-actuated switch 17, the capacitor 12 recharges from battery 11 via resistor 13.

During the aforesaid momentary activation of the transistor amplifier 15, a current pulse is applied to the impedance network of the lamp array 31. Assuming that none of the lamps 36–39 has been flashed, the first lamp 36 will be flashed by the current pulse, because this pulse is only of sufficient time duration and hence energy, as determined by the time constant set by the chosen values of the capacitor 12 and discharge resistors 19 and 20, to fire the lamp 36, whereupon there is insufficient remaining pulse energy to flash the second lamp 37 via the resistor 42. Upon occurrence of a second firing pulse, the first lamp 36 is an open circuit, and the pulse energy flows through resistors 41 and 42 whereupon most of the pulse energy flows through the second lamp 37 causing it to flash. As each lamp becomes flashed, the impedance of the array increases, due to additional ones of the resistors 41-44 being in series with the nearest unflashed lamp. As described above, this has been a serious problem in the past because it causes successive reductions in the amount of firing pulse energy applied to the successive lamps to be flashed.

The invention makes use of the constant-current characteristic of a transistor amplifier, i.e., the output current into the output load of a transistor amplifier is independent of the impedance value of the load. Thus, as the impedance of the lamp array network 31 increases with each lamp flashing, the current value of the firing pulses remains constant, resulting in increased firing pulse power being delivered to the array network 31 for flashing each successive lamp. These increases in pulse power delivered to the network are due to the fact that the output power delivered to the load of the transistor amplifier is $$P=I^2R$$

where $P$ is the output power (in watts), $I$ is the current in the output load (in amperes), and $R$ is the resistance of the output load (in ohms). Since the amplifier output current $I$ delivered through the network 31 is the same for each lamp flashing, and since the network resistance $R$ is larger for each lamp flashing, the firing pulse power delivered to the network will be larger for each lamp flashing. This greater pulse power per flashing compensates for the increases in power per flashing lost in the successive increases in network resistance caused by the resistors 41–44 successively being in series with the lamp to be flashed, whereby, in accordance with an objective of the invention, equal amounts of firing pulse energy are delivered to the lamps as they are flashed, thereby increasing reliability of operation and ensuring that a single lamp will flash per firing pulse. The aforesaid successive increases in firing pulse energy delivered to the load network 31 is caused by successive changes in the emitter-collector impedance of the transistor 15 resulting in successive increases in output voltage of the amplifier output pulses.

The just-described improved operation achieved by the invention is illustrated by FIG. 3, in which the horizontal base line represents five lamps of an array and the vertical axis 51 represents firing pulse energy, as in FIG. 2. In FIG. 3, the solid-line portions of plot 52 indicate the energy of each firing pulse as supplied by the battery 11, this energy being the same for each firing pulse. Plot 55 represents the energy dissipated at the collector junction of the transistor 15, which decreases at each lamp flashing. Plot 56 represents the firing pulse energy delivered to the array load 31 which increases as each lamp is flashed, as has been described above. Expressed another way, the amplifier 15 reduces the amount of firing pulse energy reaching the lamp array 31 when the first lamp 36 is flashed, and this reduction of energy diminishes for each successive lamp flashing. Plot 57 represents, in the solid-line portions thereof, the amount of firing pulse energy applied to each lamp that is flashed, these amounts of firing pulse energy being the same for each lamp due to the variable-gain functioning of the amplifier 15, as described above.

In accordance with a feature of the invention, the value of capacitor 12 is relatively small, such as 100 microfarads or less, since it functions only as part of a time-constant circuit for applying turn-on bias to the base 21 of the transistor 15, and it is not required to supply pulse energy to the lamp array 31. However, if desired, the connection from the contact 28 may be made to the junction 58 of capacitor 12 and resistor 13, instead of to the battery 11 as shown in FIG. 1, whereupon the energy pulses will be supplied to the array network 31 by the capacitor 12. This would require a larger value of capacitance for the capacitor 12, for example 500 microfarads or greater.

After all of the lamps in the array 31 have been flashed, the array may be discarded, and a new array may be plugged into operative position.

The resistors 41–44 can be incorporated into a camera or flash adaptor instead of in a disposable flash array, with the requisite number of electrical connectors being provided for connecting the filament lead wires of the lamps 36, etc., of the array respectively to the different connection terminal points 60 of the series resistors network.

The invention can be applied to various types of sequential flash-control circuits or networks which have the above-described characteristic of a changing value of impedance as the various lamps are flashed. The firing pulse is applied to such a circuit by means of a transistor amplifier, and the gain (or loss) of the amplifier is controlled by the changing impedance of the lamp circuit output load of the transistor amplifier so as to apply a desired amount of firing pulse energy to each lamp that is flashed.

While preferred embodiments and modifications of the invention have been shown and described, other embodiments and modifications thereof will become apparent to persons skilled in the art, and will fall within the scope of invention as defined in the following claims.

What I claim as new and desire to secure by Letters Patent of the United States is:

1. A circuit for causing a plurality of photoflash lamps to be flashed sequentially by sequential electrical firing pulses derived from a source of electrical energy, comprising a plurality of said flash lamps and impedance means electrically interconnecting said lamps thereby forming an impedance network adapted to be connected to a source of sequential firing pulses and cause a predominant amount of each sequential firing pulse to be applied to a single unflashed lamp, said impedance network having the characteristic of changing impedance as the lamps are flashed, wherein the improvement comprises a transistor amplifier interconnecting said impedance network and said source of electrical energy whereby said impedance network constitutes an output load impedance of said transistor amplifier, and control means connected to the input of said transistor amplifier for rendering the transistor amplifier successively conductive to apply successive firing pulses to said impedance network.

2. A circuit as claimed in claim 1, in which said impedance network comprises a plurality of resistances successively connected electrically in series between said lamps thereby connecting the lamps in an electrical parallel circuit through said resistances, means connecting a first lamp at one end of said parallel circuit between the collector output electrode of said transistor amplifier and a terminal of said source of electrical energy, and means connecting the emitter output electrode of said transistor amplifier to the other terminal of said source of electrical energy.

3. A circuit as claimed in claim 1, in which said control means comprises a capacitor, a pair of terminals for connection to a voltage source, means including a resistor connecting said capacitor for being charged from said voltage source and a discharge resistor and a switch means connected across said capacitor whereby said capacitor will discharge through said discharge resistor when said switch means is closed thereby producing a voltage pulse across said resistor having a time duration determined by the R-C time constant of said capacitor and discharge resistor, and means for applying said voltage pulse to the base electrode of said transistor amplifier for rendering the transistor amplifier momentarily in a conductive state.

4. A circuit as claimed in claim 3, in which said impedance network comprises a plurality of resistances successively connected electrically in series between said lamps thereby connecting the lamps in an electrical parallel circuit through said resistances, means connecting a first lamp at one end of said parallel circuit between the collector output electrode of said transistor amplifier and one of said pair of terminals, and means connecting the emitter output electrode of said transistor amplifier to the other terminal of said pair of terminals.

5. A circuit as claimed in claim 1, in which said source of electrical energy and said control means comprise a capacitor, a pair of terminals for connection to a voltage source, means including a resistor connecting said capacitor for being charged from said voltage source, and switch means connected to selectively apply the voltage charge of said capacitor to the base electrode of said transistor amplifier for rendering the transistor amplifier in a conductive state, and in which said impedance network comprises a plurality of resistances successively connected in series between said lamps thereby connecting the lamps in an electrical parallel circuit through said resistances, said circuit further including means connecting a first lamp at one end of said parallel circuit between the collector output electrode of said transistor amplifier and one end of said capacitor, and means connecting the emitter output electrode of said transistor amplifier to the other end of said capacitor.

6. A firing pulse circuit for applying firing pulses sequentially to an impedance network comprising a plurality of photoflash lamps and impedance means electrically interconnecting said lamps, said circuit comprising a pair of terminals for connection to a voltage source, a capacitor and a charging resistor connected in series across said pair of terminals, a switch means having a first terminal connected to a first end of said capacitor and having a second terminal, and a pair of output terminals adapted for connection thereto of said flash lamp impedance network, wherein the improvement comprises a transistor having base, emitter, and collector electrodes, means connecting said second switch terminal to said base electrode, means connecting said emitter electrode to the second end of said capacitor, means connecting one of said output terminals to said collector electrode, and means connecting the other of said output terminals to said charging resistor.

7. A firing pulse circuit as claimed in claim 6, in which said other output terminal is connected to the junction of said charging resistor and one of said terminals for connection to a voltage source, said circuit further including a discharge resistor connected between said second switch terminal and said second end of the capacitor.

8. A firing pulse circuit as claimed in claim 6, in which said other output terminal is connected to the junction of said charging resistor and said capacitor.

* * * * *